United States Patent [19]
Umeyama et al.

[11] Patent Number: 5,852,521
[45] Date of Patent: Dec. 22, 1998

[54] AMPLIFIER CIRCUIT SUPPRESSING DISTURBANCE SIGNAL PRODUCED BY MAGNETORESISTIVE HEAD

[75] Inventors: Takehiko Umeyama; Tsutomu Kamifuji, both of Tokyo, Japan

[73] Assignee: Mitsubishi Denki Kabushiki Kaisha, Tokyo, Japan

[21] Appl. No.: 674,011

[22] Filed: Jul. 1, 1996

[30] Foreign Application Priority Data

Nov. 28, 1995 [JP] Japan ................................ 7-309259

[51] Int. Cl.⁶ ............................................. G11B 5/09
[52] U.S. Cl. ........................ 360/46; 327/558; 327/553; 330/149; 360/67; 360/65
[58] Field of Search .................... 327/558, 551, 327/553, 552; 330/151, 149; 360/46, 67, 68, 65; 455/307, 306, 305, 296

[56] References Cited

U.S. PATENT DOCUMENTS

| 4,914,398 | 4/1990 | Jove et al. | |
|---|---|---|---|
| 5,396,188 | 3/1995 | Aoki | 327/552 |
| 5,428,314 | 6/1995 | Swafford, et al. | 330/149 |
| 5,648,738 | 7/1997 | Welland et al. | 327/307 |

*Primary Examiner*—Alan Faber
*Attorney, Agent, or Firm*—Leydig, Voit & Mayer

[57] ABSTRACT

An amplifier for an MR head comprises a means for switching cut-off frequencies of a plurality of lowpass filters, when a data signal superposed by a disturbance signal (a composite signal) is input from an MR head, a means for extracting the disturbance signal from the composite signal, a means for adding the extracted disturbance signal to the composite signal. Accordingly, it possible to obtain a data signal less influenced and less distorted even if a disturbance signal appears.

12 Claims, 14 Drawing Sheets

FIG. 3A WAVEFORM AT INPUT POINT A
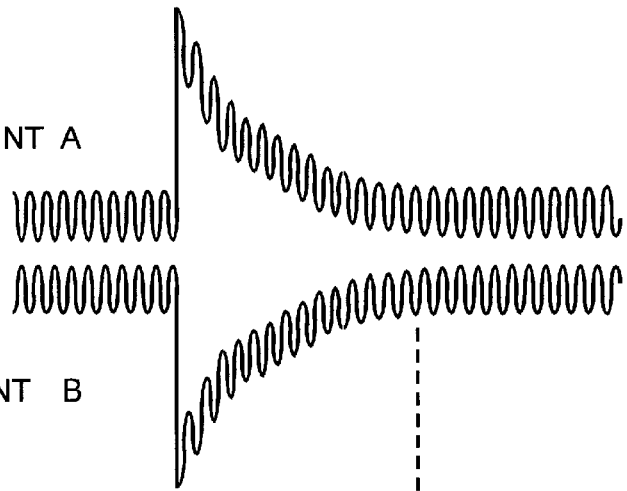
FIG. 3B WAVEFORM AT INPUT POINT B
FIG. 3C WAVEFORM AT INPUT POINT C
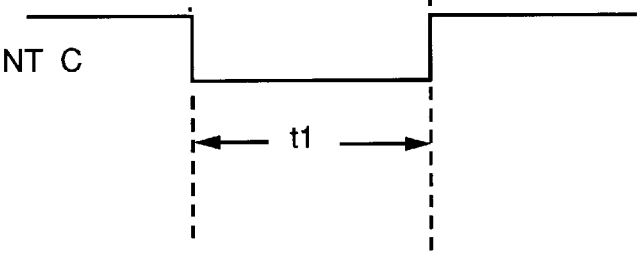
t1
FIG. 3E WAVEFORM AT NODE E
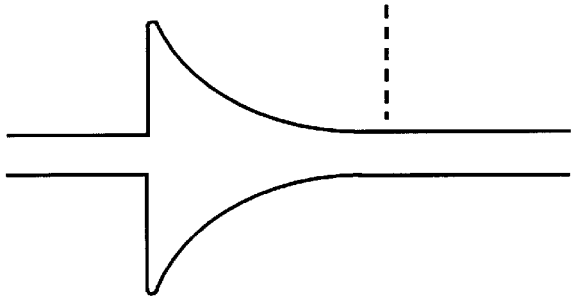
FIG. 3F WAVEFORM AT NODE F
FIG. 3G WAVEFORM AT OUTPUT POINT G
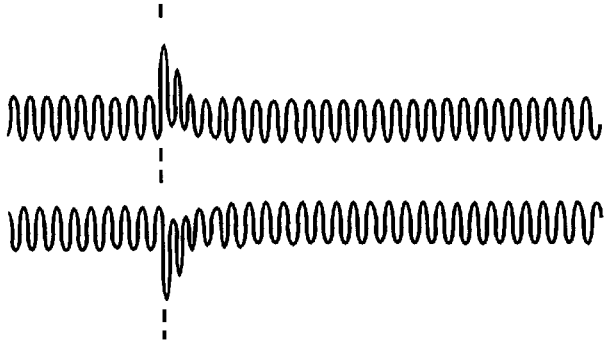
FIG. 3H WAVEFORM AT OUTPUT POINT H

DATA SIGNAL

DISTURBANCE SIGNAL

COMPOSITE SIGNAL

INPUT WAVEFORM OF
DISTURBANCE SIGNAL
SUPPRESSION CIRCUIT
133

OUTPUT SIGNAL OF
DELAY CIRCUIT 136

OUTPUT SIGNAL OF
ADDING CIRCUIT 140

OUTPUT SIGNAL OF
DISTURBANCE SIGNAL
SUPPRESSION CIRCUIT
133

AMPLIFIER CIRCUIT SUPPRESSING DISTURBANCE SIGNAL PRODUCED BY MAGNETORESISTIVE HEAD

BACKGROUND OF THE INVENTION

1. Field Of The Invention

The present invention relates to a hard disk drive, especially an amplifier circuit that is used as a reading amplifier for a head constructed of magnetoresistance elements (referred to as an MR head hereafter) and that suppresses the influence of heat disturbances on the MR head and that has a simple construction.

2. Description Of The Prior Art

FIG. 10 shows a general block diagram of a hard disk drive. In FIG. 10, data recorded on a disk 101 is read by an MR head 103. Signals read by the MR head 103 are transmitted to a personal computer 107 through a read/write (R/W) amplifier 104, a read channel 105, and a hard disk controller (HDC) 106 for processing in the personal computer. The position of the MR head 103 is controlled by the read channel 105 through a central processing unit (CPU) 110, a voice coil motor (VCM) driver 109, and a VCM 108. Rotation of the disk 101 is controlled by the read channel 105 through the CPU 110, an SPM driver 111, and an SPM 112. Further, in accordance with instructions from the personal computer 107, data signals are sent to a writing head 102 through the HDC 106, the read channel 105, and the R/W amplifier 104. Then, data is written on the disk 101 by the writing head 102.

Generally, the MR head 103 is used in a floating state, spaced from the surface of the disk 101 of the hard disk drive. When the MR head 103 comes into contact with the surface of the disk 101, the MR head 103 is heated instantly, and its resistance rises. The contact is usually momentary, and the MR head 103 is soon out of contact with the surface of the disk 101. However, the heat generated in the MR head 103 is radiated slowly. As a result, a disturbance signal having a long period is generated as shown in FIG. 12B. The disturbance signal (FIG. 12B) and a data signal read from the disk 101 (FIG. 12A) are superposed in the MR head 103, and a composite of the disturbance signal and the data signal are output from the MR head 103 as shown in FIG. 12C. Such a phenomenon, where the disturbance signal generated by the rising resistance of the heated MR head 103 is superposed on the data signal, is referred to as thermal asperity.

FIG. 11 shows a reading portion of a conventional read/write amplifier 104 shown in FIG. 10. In FIG. 11, the signals read from the disk 101 are amplified in the pre-amplifier 131. Then, the heat disturbance generated in the MR head 103 is removed in the disturbance signal suppression circuit 133, and the signals are output to the output terminals 5 and 6.

FIG. 12A–12C are waveforms that show how the disturbance generated by contact of the MR head with a disk affects the data signal. FIG. 12A shows a data signal read by the MR head 103. FIG. 12B shows a disturbance signal that depends on the change of the resistance of MR elements when the MR head 103 comes into contact with the surface of the disk 101. FIG. 12C shows a composite signal in which the disturbance signal caused by rising of the resistance of the heated MR head is superposed on the data signal.

FIG. 13 shows an example of a conventional circuit implementation of the disturbance signal suppression circuit 133 shown in FIG. 11. The circuit of FIG. 13 comprises an input terminal 121 receiving the composite signal, the superposed data signal and disturbance signal, a delay circuit 136 for delaying the input composite signal, envelope extracting circuits 137 and 138 for extracting the envelopes of a lower portion and an upper portion of the composite signal, respectively, a buffer 139, adding circuits 140 and 143, and an output terminal 123.

FIG. 14A shows the composite signal where data signal and disturbance signal are superposed. FIG. 14B shows an output signal of the delay circuit 136. FIG. 14C shows an output signal of the adding circuit 140. FIG. 14D shows an output signal of the adding circuit 143. In other words, the final disturbance signal output from the output terminal 123 of the disturbance signal suppression circuit 133 has a waveform of a data signal with a suppressed disturbance signal.

The operation of the conventional circuit is explained below using FIG. 13 and FIGS. 14A–14D. In FIG. 13, respective envelopes of the lower portion and upper portion of the waveform shown in FIG. 14A are extracted by envelope extracting circuits 137 and 138, and added. Then, alternating current components are removed through a low pass filter 141. The signal amplitude is regulated by an attenuator 142, inverted, and added to the signal passing through the delay circuit 136. Thereby, a signal with a suppressed disturbance waveform is obtained as shown in FIG. 14D.

In other words, the disturbance signal is extracted from data signal input into the input terminal 121 (FIG. 14A) using the envelope extracting circuits 137 and 138, the buffer 139, the adding circuit 140, and the low pass filter 141. The amplitude of the extracted disturbance signal is regulated in the attenuator 142. Then, in the adding circuit 143, the disturbance signal is added to (or subtracted from) the composite signal input into the input terminal 121 and delayed at the delay circuit. Thereby, the disturbance signal superposed on the data signal input into the input terminal 121 is removed.

However, the disturbance signal suppression circuit 133 is complicated and characteristics of elements comprising the circuit are required to be manufactured accurately. Sags caused by a disturbance signal often remain in a reproduced signal.

SUMMARY OF THE INVENTION

According to one aspect of the invention, an amplifier for MR head comprises means for switching cut-off frequencies of a plurality of low pass filters when a data signal superposed by a disturbance signal (a composite signal) is input from an MR head; means for extracting the disturbance signal from the composite signal; and means for adding the extracted disturbance signal to the composite signal.

According to another aspect of the invention, an amplifier for an MR head comprises a first input terminal for receiving a data signal superposed on a disturbance signal (a composite signal) from the MR head; a second input terminal for receiving a signal inverted from the data signal input into the first input terminal; a first differential amplifier for receiving the signal input into the first terminal and the inverted signal input into the second terminal and for outputting the two signals; an LPF switching signal generation circuit for generating a control signal having a predetermined period when the disturbance signal appears from the MR head; a first low pass filter for receiving the composite signal at the non-inverting input terminal and for switching cut-off frequencies according to the control signal and for outputting a resultant filtered signal to an inverting output terminal of the first differential amplifier; and a second low pass filter for receiving the inverted composite signal at the inverting input terminal and for switching cut-off frequencies according to the control signal and for outputting a resultant filtered signal to a non-inverting output terminal of the first differential amplifier.

According to a yet another aspect of the invention, an amplifier for an MR head further comprises a second differential amplifier for receiving a signal output from the first low pass filter at a non-inverting terminal and receiving a signal output from the second low pass filter at an inverting terminal, the non-inverting output terminal being connected to the inverting output terminal of the first differential amplifier and the inverting output terminal being connected to the non-inverting output terminal of the first differential amplifier.

According to a further aspect of the invention, an amplifier for an MR head comprises a first DC level regulation circuit for receiving an output of the first low pass filter and for equalizing a DC level of a non-inverting terminal of a second differential amplifier to a DC level of an inverting terminal of the first differential amplifier; and a second DC level regulation circuit for receiving an output of the second low pass filter and for equalizing a DC level at an inverting terminal of a second differential amplifier to a DC level of a non-inverting terminal of the first differential amplifier.

According to still another aspect of the invention, an amplifier for an MR head comprises an LPF switching signal generation circuit including a comparator having a first input terminal connected to a non-inverting input terminal and another input terminal connected to a constant voltage source; and a one-shot circuit connected to an output terminal of the comparator for outputting a pulse having a predetermined period.

According to an aspect of the invention, an amplifier for an MR head including first and second low pass filters comprises a series circuit of a first resistor and a capacitor connected between an input terminal and a ground terminal; and a series circuit of a second resistor and a MOS transistor, connected in parallel to the first resistor, wherein a pulse having a predetermined period and received from the LPF switching signal generation circuit is applied to the MOS transistor and a resultant filtered output of the low pass filter is output from a node of the first resistor and the capacitor.

According to still another aspect of the invention, in an amplifier for an MR head, when an LPF switching signal is not input from the LPF switching signal generation circuit, each first and second low pass filter has a first cut-off frequency, and when a pulse having a predetermined period and received from the LPF switching signal generation circuit is applied to each MOS transistor, each first and second low pass filter operates as a low pass filter having a second cut-off frequency.

According to yet another aspect of the invention, an amplifier for an MR head comprises a first input terminal for receiving a data signal and a superposed disturbance signal (a composite signal) from the MR head; a second input terminal for receiving a signal that is inverted from the data signal input into the first input terminal; a first differential amplifier for receiving the signal input to the first terminal and the inverted signal input to the second terminal and outputting the two signals; an LPF switching signal generation circuit for generating a first control signal having a first predetermined period and a second control signal having a second predetermined period when the disturbance signal appears from the MR head; a first low pass filter for receiving the composite signal at the non-inverting input terminal and for switching cut-off frequencies according to the first control signal and the second control signal and for outputting a resultant filtered signal to an inverting output terminal of the first differential amplifier; and a second low pass filter for receiving the inverted composite signal at the inverting input terminal and for switching cut-off frequencies according to the first control signal and the second control signal and for outputting a resultant filtered signal to a non-inverting output terminal of the first differential amplifier.

According to another aspect of the invention, an amplifier for an MR head further comprises a second differential amplifier for receiving a signal output from the first low pass filter at a non-inverting terminal and receiving a signal output from the second low pass filter at an inverting terminal, the non-inverting output terminal being connected to the inverting output terminal of the first differential amplifier and the inverting output terminal being connected to the non-inverting output terminal of the first differential amplifier.

According to a further aspect of the invention, an amplifier for an MR head comprises a first DC level regulation circuit for receiving an output of first low pass filter and equalizing a DC level of a non-inverting terminal of a second differential amplifier to a DC level of an inverting terminal of the first differential amplifier; and a second DC level regulation circuit for receiving an output of the second low pass filter and for equalizing a DC level of an inverting terminal of a second differential amplifier to a DC level of a non-inverting terminal of the first differential amplifier.

According to another aspect of the invention, an amplifier for an MR head including an LPF switching signal generation circuit comprises a comparator having one input terminal connected to a non-inverting input terminal and another input terminal connected to a constant voltage source; a first one-shot circuit connected to an output terminal of the comparator for outputting a pulse having a first predetermined period; and a second one-shot circuit connected to an output terminal of the comparator for outputting a pulse having a second predetermined period.

According to still another aspect of the invention, an amplifier for an MR head includes first and second low pass filters comprising a series circuit of a first resistor and a capacitor connected between an input terminal and a ground terminal; a series circuit of a second resistor and a first MOS transistor connected in parallel to the first resistor; a series circuit of a third resistor and a second MOS transistor connected in parallel to the first resistor, wherein a first pulse having a first period received from the LPF switching signal generation circuit is applied to a first MOS transistor, a second pulse having a second period received from the LPF switching signal generation circuit is applied to a second MOS transistor, and a resultant filtered output of the low pass filter is output from a node of the first resistor and the capacitor.

According to yet another aspect of the invention, an amplifier for an MR head in which, when an LPF switching signal is not input from an LPF switching signal generation circuit, each of first and second low pass filters operates as a low pass filter having a first cut-off frequency; a first pulse having a first period received from the LPF switching signal generation circuit is applied to a first MOS transistor, the first and second low pass filters operating as a low pass filter having a second cut-off frequency; and a first pulse having a first period and a second pulse having a second period received from the LPF switching signal generation circuit are applied to a first MOS transistor and a second MOS transistor, respectively, the first and second low pass filters operating as a low pass filter having a third cut-off frequency.

According to an aspect of the invention, a reading amplifier for an MR head comprises a pre-amplifier and an amplifier for an MR head, wherein, in the pre-amplifier, the base of a first transistor is connected to a constant voltage source, the emitter of the first transistor is connected to the collector of a second transistor, the collector of the first transistor is connected to a power supply through a resistor and to a non-inverting terminal of a third differential amplifier and a non-inverting terminal of a loop amplifier, the emitter of the second transistor is connected to an MR head, the base of the second transistor is connected to the output of the loop amplifier, the collector of a third transistor is connected to an inverting terminal of the loop amplifier and to a power.supply through a resistor, the base is connected to a constant voltage source, the emitter is grounded through a constant current source; and the amplifier for the MR head further comprises a first differential amplifier for receiving the non-inverting output of the third differential amplifier at a non-inverting input terminal and an anti-phase output signal of the third differential amplifier at an inverting input terminal; an LPF switching signal generation circuit for generating a first control signal having a first predetermined period and a second control signal having a second predetermined period, shorter than the first period when the disturbance signal is applied from the MR head to a non-inverting input terminal and an inverting input terminal; a first low pass filter for receiving the composite signal at the non-inverting input terminal and for switching cut-off frequencies according to the first control signal and the second control signal and for outputting a resultant filtered signal to an inverting output terminal of the first differential amplifier; and a second low pass filter for receiving the inverted composite signal at the inverting input terminal and for switching cut-off frequencies according to the first control signal and the second control signal and for outputting a resultant filtered signal at a non-inverting output terminal of the first differential amplifier.

BRIEF DESCRIPTION OF THE DRAWINGS

FIGS. 3A–3C and 3E–3H show signal waveforms at respective nodes in the circuit shown in FIG. 2 when a disturbance signal is generated.

DETAILED DESCRIPTION OF PREFERRED EMBODIMENTS

Embodiment 1

Figure 1:
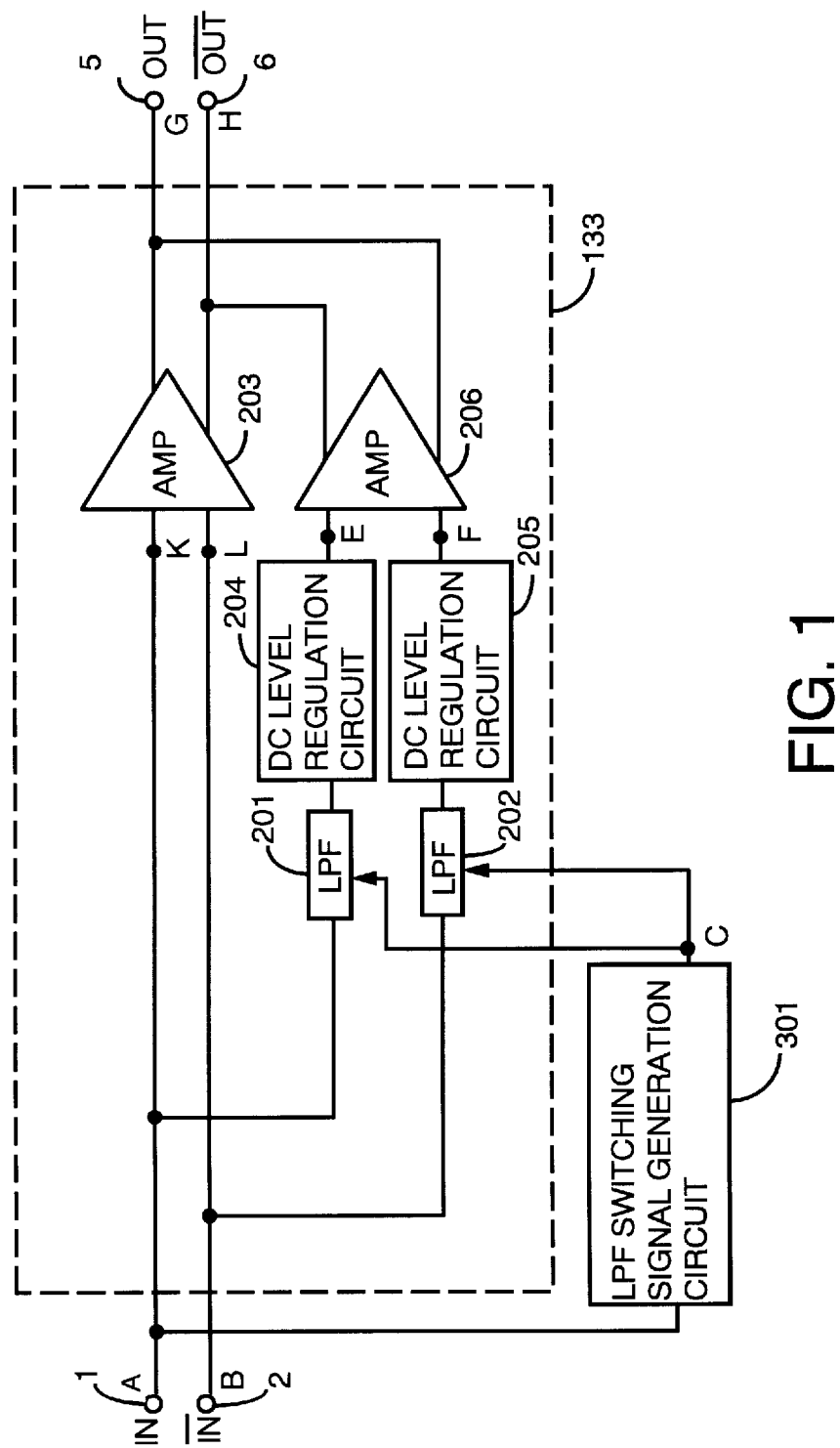
FIG. 1 shows a disturbance signal suppression circuit for suppressing a disturbance waveform and an LPF switching signal generation circuit of a first embodiment of the present invention.
Figure 2:
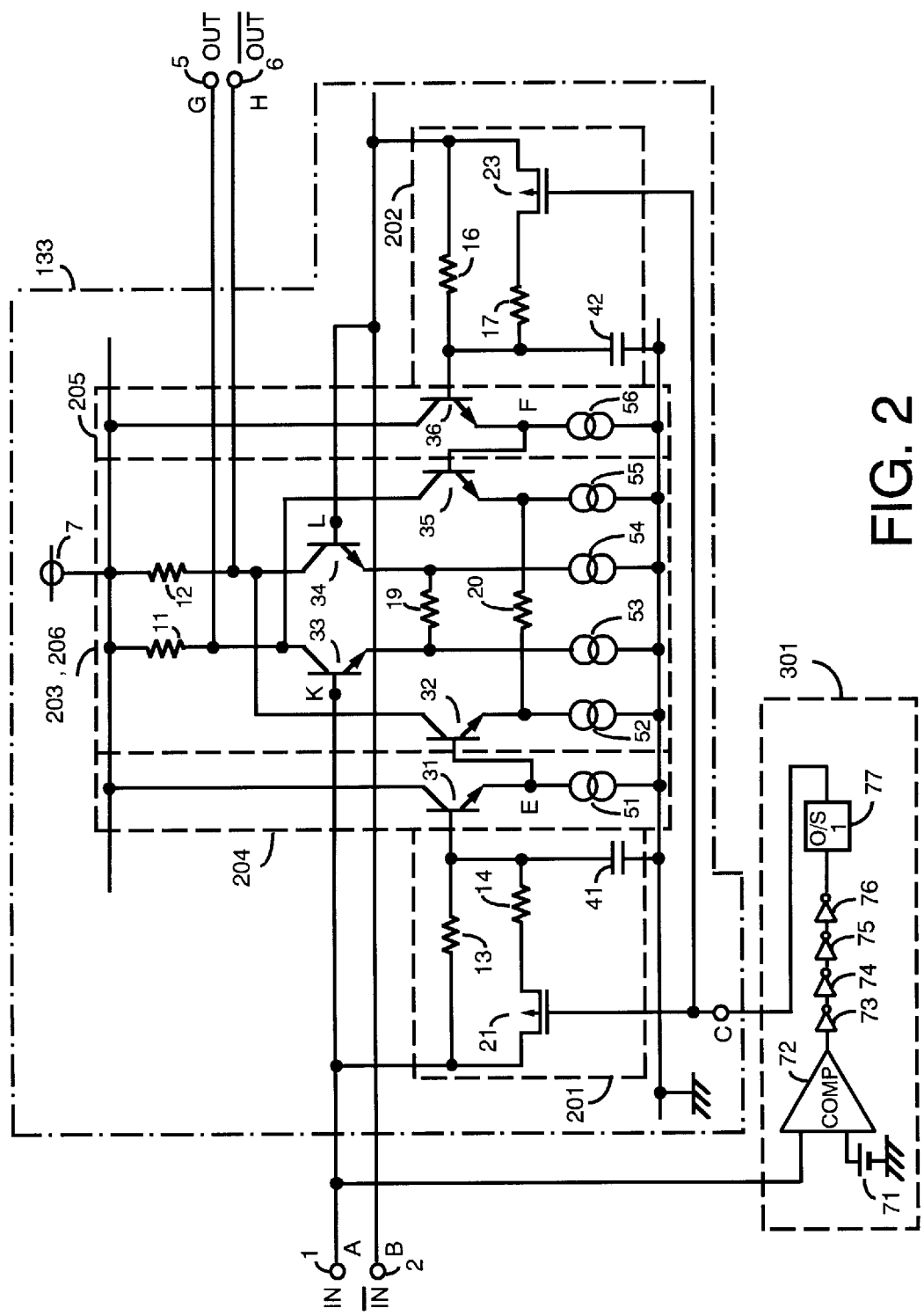
FIG. 2 shows a circuit of a first embodiment of the present invention realized using transistors.
Figure 13:
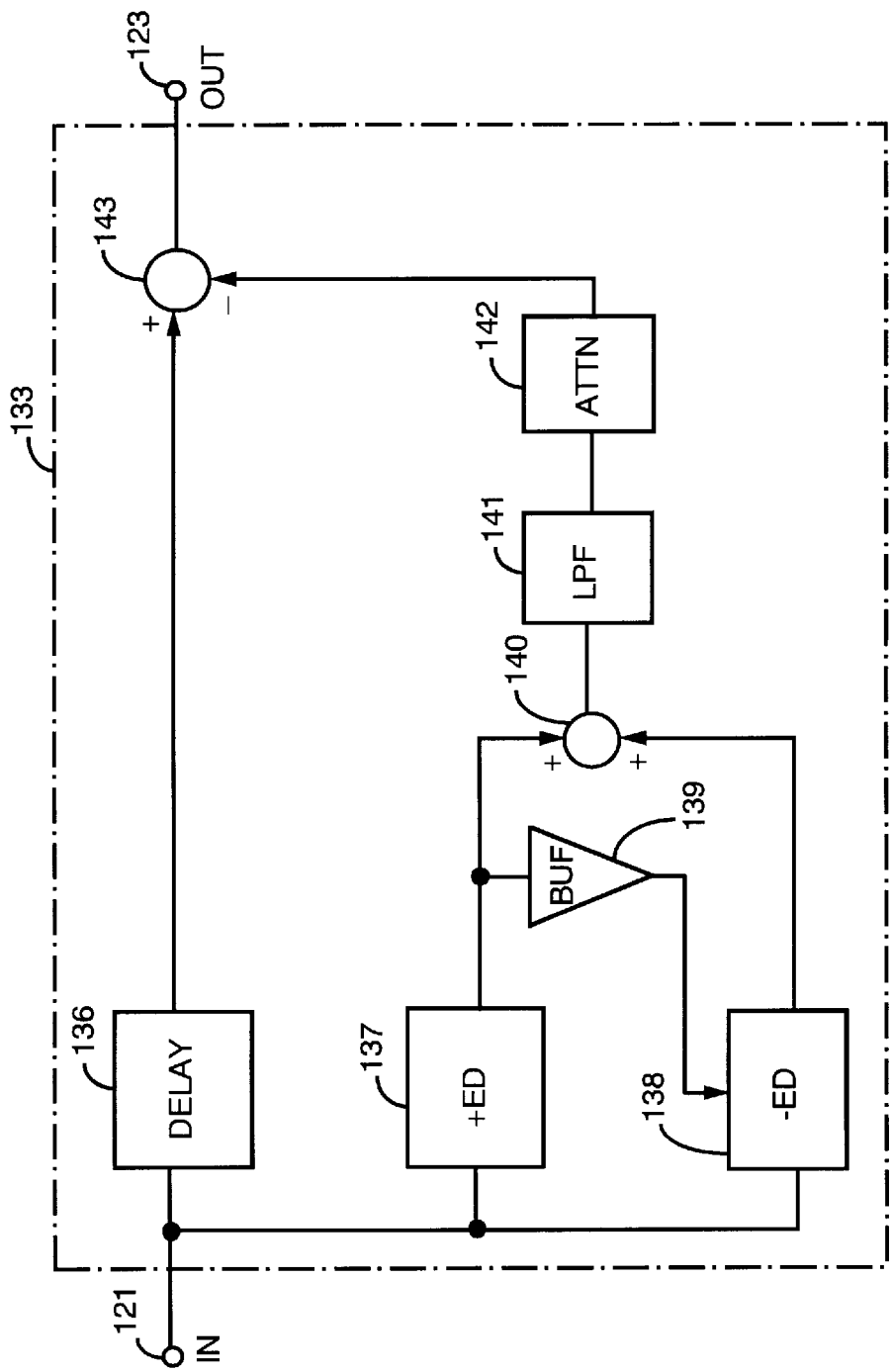
FIG. 13 shows a conventional disturbance signal suppression circuit.
Figure 14A:
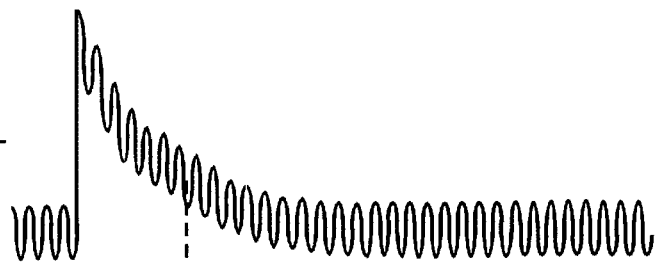
FIGS. 14A–14D show signal waveforms at respective nodes in the conventional disturbance signal suppression circuit.
Figure 14B:
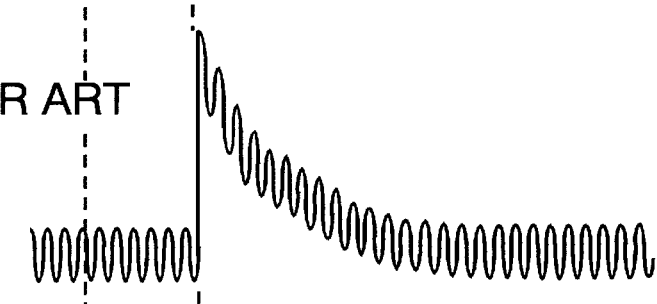
Figure 14C:
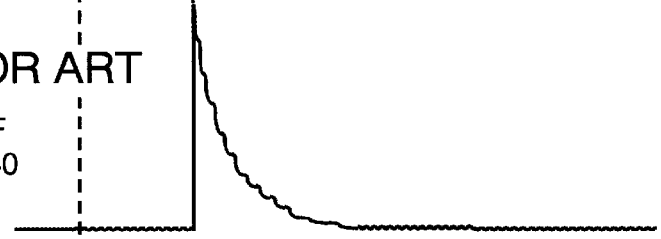
Figure 14D:
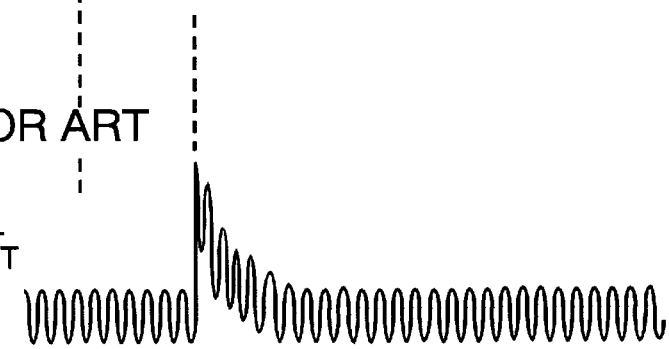

A first embodiment of the present invention is explained using FIG. 1 and FIG. 2. FIG. 1 shows a disturbance signal suppression circuit 133, one portion of an amplifier for an MR head for suppressing a disturbance waveform, and an LPF switching signal generation circuit 301 for detecting a disturbance signal caused by thermal asperity, in accordance with a first embodiment of the present invention. The disturbance signal suppression circuit 133 is incorporated into the R/W amplifier 104 shown in FIG. 11 and replaces the conventional disturbance signal suppression circuit shown in FIG. 13. FIG. 2 illustrates an embodiment of the circuit of FIG. 1 as an IC (integrated circuit).

The disturbance signal suppression circuit 133 of FIG. 1 comprises a non-inverting input terminal 1 that receives a non-inverted data signal from the pre-amplifier 131 and an inverting input terminal 2 that receives an inverted data signal from the pre-amplifier 131. At the inverting input terminal 2, an anti-phase signal, inverted with respect to the signal at the non-inverting input terminal 1, is input Low pass filter (LPF) 201 eliminates the disturbance waveform included in the composite signal input at the non-inverting input terminal 1. The LPF 202 eliminates the disturbance waveform included in the data signal input at the inverting input terminal 2. The amplifier 203 amplifies the data signals input from the non-inverting input terminal 1 and the inverting input terminal 2 and outputs them to the terminals 5 and 6, respectively.

The DC level regulation circuit 204 equalizes the DC level (at node E) output from the LPF 201 and the DC level (at node K) at the non-inverting terminal of the amplifier 203. The DC level regulation circuit 205 also equalizes the DC level (at node F) output from the LPF 202 and the DC level (at node L) at the inverting terminal of the amplifier 203. The DC level regulation circuit is used in order to cancel the disturbance signal components completely when the amplified signal from the inverting terminal of the amplifier 203 and the amplified signal from the non-inverting terminal of the amplifier 206 are added by equalizing the DC levels at the non-inverting terminal of the amplifier 203 (at node K) and the non-inverting terminal of the amplifier 206 (at node E). Accordingly, when the DC levels of the non-inverting terminal of the amplifier 206 (at node E) and the non-inverting terminal of the amplifier 203 (at node K) are the same, the DC level regulation circuits 204 and 205 need not be provided.

The amplifier 206 amplifies the outputs from the DC level regulation circuits 204 and 206. Signals input into the non-inverting input terminal of the amplifier 206 are output from a non-inverting output terminal of the amplifier 206 and added to the signal from the non-inverting output terminal of the amplifier 203. By such addition, the disturbance signal is canceled and not output to the output terminals 5 and 6, respectively.

The LPF switching signal generation circuit 301 detects the generation of a disturbance signal and generates a signal (FIG. 3C) to switch LPF characteristics. FIG. 3C shows a first LPF switching signal. Node C is a pulse signal output terminal where a pulse signal for switching cut-off frequency of the LPFs 201 and 202 is output. The disturbance signal suppression circuit 133 comprises LPFs 201 and 202 and the amplifier 203. The disturbance signal suppression circuit 133 of FIG. 1 further includes output terminals 5 and 6. The signals of output terminals 6 and 5 are anti-phase signals.

Figure 4:
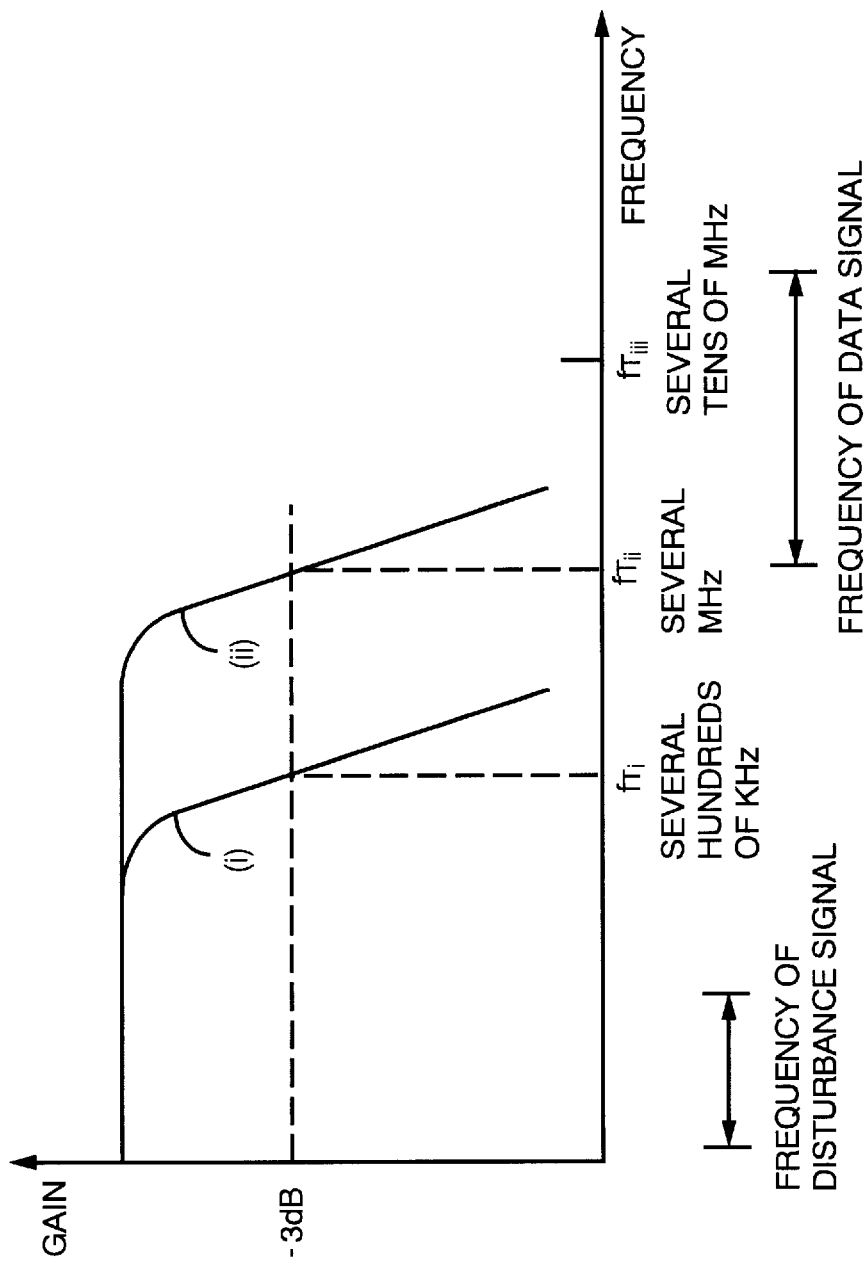
FIG. 4 shows a frequency characteristic of an LPF in a first embodiment of the present invention.

FIG. 2 shows a disturbance signal suppression circuit 133 that suppresses a disturbance signal and an LPF switching signal generation circuit 301 shown in FIG. 1. The signals in FIGS. 3A–3C and FIGS. 3E–3H show signal waveforms in the disturbance signal suppression circuit 133, that correspond to the nodes A–C and the nodes E–H, respectively, when the disturbance signal is input. FIG. 4 illustrates cutoff frequencies of the LPFs 201 and 202, respectively. The structure of FIG. 2 is explained in detail below.

Amplifier 203

The amplifier 203 in FIG. 2 comprises resistors 11, 12, and 19, transistors 33 and 34, and constant current sources 53 and 54. The collector of the transistor 33 is connected to the non-inverting output terminal 5 and to the power supply 7 through the resistor 11. The emitter of the transistor 33 is grounded through the constant current source 53. The base of the transistor 33 is connected to the non-inverting input terminal 1. The collector of the transistor 34 is connected to the inverting output terminal 6 and to the power supply 7 through the resistor 12. The emitter of the transistor 34 is grounded through the constant current source 54. The base of the transistor 34 is connected to the inverting input terminal 2. The transistor 33 amplifies signals input at the non-inverting input terminal 1 and outputs the amplified signals to the non-inverting output terminal 5. The transistor 34 amplifies signals input from the inverting input terminal 2 and outputs the amplified signals to the inverting output terminal 6. The resistor 19 is a common emitter resistor for emitter followers of the transistor 33 and the transistor 34.

Amplifier 206

The amplifier 206 of FIG. 1 comprises resistors 11, 12, and 20, transistors 32 and 35, and constant current sources 52 and 55. The collector of the transistor 32 is connected to the inverting output terminal 6 and to the power supply 7 through the resistor 12. The emitter of the transistor 32 is grounded through the constant current source 52. The base of the transistor 32 is connected to node E, an output terminal of the DC level regulation circuit 204, as described below.

The collector of the transistor 35 is connected to the non-inverting output terminal 5 and to the power supply 7 through the resistor 11. The emitter of the transistor 35 is grounded through the constant current source 55. The base of the transistor 35 is connected to a node F, an output terminal of the DC level regulation circuit 205, as described below. Transistor 32 amplifies a signal input from the DC level regulation circuit 204 and outputs the amplified signal to the inverting output terminal 6.

The transistor 35 amplifies a signal input from the DC level regulation circuit 205 and outputs the amplified signal to the non-inverting output terminal 5. The resistor 20 is a common emitter resistor for emitter followers of the transistor 32 and the transistor 35. As described above, the output of amplifiers 206 and 203 are cross-connected to each other. Therefore, signals from the non-inverting input terminal 1 (at node K) and the signal from output terminal node F of the DC level regulation circuit 205 are subtracted and output to the non-inverting output terminal 5. On the other hand, a signal from the inverting input terminal 2 (at node L) and a signal from output terminal node E of the DC level regulation circuit 204 are subtracted and the difference is output to the inverting output terminal 6.

LPF 201 and 202

In FIG. 2, the LPF 201 of FIG. 1 comprises resistors 13 and 14, a capacitor 41, and a P-channel MOS 21. Similarly, the LPF 202 of FIG. 1 comprises resistors 16 and 17, a capacitor 42, and a P-channel MOS 23. The resistances of the resistors 13, 16, 14, and 17 decrease in the order of the reference number. For example, the resistances of the resistors 13 and 16 are several tens of KΩ and the resistances of the resistors 14 and 17 are several KΩ. The most suitable capacitances of the capacitors 41 and 42 (for example, several tens of pF) are selected in order to produce appropriate cut-off frequencies. The first low pass filter (characteristic (i) of FIG. 4) comprises the resistor 13 and the capacitor 41. The second low pass filter (characteristic (ii) of FIG. 4) comprises the capacitor 41 and a parallel circuit of the resistors 13 and 14, which is realized by turning on the P-channel MOS 21 according to the first signal from node C of the LPF switching signal generation circuit 301. The cut-off frequency of the first low pass filter is selected to be, for example, several hundreds of KHz. The cut-off frequency of the second low pass filter is selected to be, for example, several MHz. As for the low pass filter 202, the explanation is omitted because it has a construction similar to the low pass filter 201.

DC Level Regulation Circuits 204 and 205

An emitter follower, which comprises the transistor 31 and the constant current source 51, comprises the DC level regulation circuit 204. An emitter follower, which comprises the transistor 36 and the constant current source 56, comprises the DC level regulation circuit 205. The outputs of the amplifiers 206 and 203 are cross-connected, and the outputs of the amplifiers 206 and 203 are subtracted, and, thereby, the disturbance signal is canceled. In other words, the collector of the transistor 33 in the amplifier 203 and the collector of the transistor 35 in the amplifier 206 are connected to the non-inverting output terminal 5. Since the transistors 31–36 have the same characteristics, the base potential of the transistor 33 (at node K) needs to be equal to the base potential of the transistor 35 (at node F) in order to cancel a disturbance signal completely. The DC level regulation circuit 205 comprising the transistor 36 and the constant current source 56 realizes this purpose. A detailed explanation is as follows. The base potential of the transistor 33 (at node K) is the sum of the voltage drop of the constant current source 53 and voltage drop between the base and the emitter of the transistor 33. The potential of the transistor 35 (at node F) is the sum of the voltage drop of the constant current source 55 and the voltage drop between the base and the emitter of the transistor 35. Therefore, it is possible to make the base potentials equal by regulating the voltage drops of both constant current sources.

LPF Switching Signal Generation Circuit 301

The LPF switching signal generation circuit 301 in FIG. 1 and FIG. 2 comprises a constant voltage source 71, a comparator 72, inverters 73-76, and a first one-shot circuit (O/S1) 77. The output of the LPF generation circuit 301 turns the P-channel MOS transistor 21 on and off and thereby connects the resistor 14 in parallel with the resistor 13 to change the characteristics of low pass filter in a plurality of stages.

The construction of the circuit is explained in detail below. The potential of the constant voltage source 71 is usually higher than the DC potential of the non-inverting input terminal 1 of the comparator 72, so the output of the comparator is always logical level "H". For example, when the DC potential of the non-inverting input terminal node A is about 4 V, the voltage of the constant voltage source 71 is set to about 4.5 V. When the potential of the non-inverting input terminal node A is higher than 4.5 V, the output of the comparator 72 changes to logical level "L", and a signal of logical level "L" is transmitted to the one-shot circuit 77 through an even number of inverters, inverters 73–76. The inverters 73–76 are used for shaping a deformed waveform output from the comparator, and they are not indispensable to operate the circuit. The one-shot circuit 77 receives signals of logical level "L" and makes the output (at node C) be logical level "L" during the time t1, as shown in FIG. 3C. When node C turns to logical level "L", the resistor 14 is connected in parallel to the resistor 13 because the P-channel MOS transistor 21 turns on. Accordingly, the resistors 13 and 14 are connected in parallel during the time t1, and the low pass filter with a cut-off frequency ($f_{Tii}$) of, for example, several MHz, has the characteristic shown by the curve (ii) of FIG. 4.

The operation of an amplifier for an MR head of the present invention, constructed as described above, is explained below. First of all, a superposed data signal (generally, about several MHz-100 MHz) and a disturbance signal (generally, less than about 200–300 KHz) (hereafter, composite signal), as shown in FIGS. 3A and 3B, are input to the non-inverting input terminal 1 (input node A) and the inverting input terminal 2 (input node B), respectively, in the disturbance signal suppression circuit 133, a portion of the amplifier for the MR head. A signal waveform input to the non-inverting input terminal 1 and the inverting input terminal 2 is input to input terminals K and L of the amplifier 203, respectively. At the same time, the signal at node A is transmitted to the LPF 201 and also to the LPF switching signal generation circuit 301. The signal of node B is transmitted to the LPF 202. Signals passing through the amplifier 203 are amplified and output to the non-inverting output terminal 5 and the inverting output terminal 6.

The signal at node A input into the LPF 201 is processed as follows. Operation and signal waveforms of the disturbance signal suppression circuit 133 and the LPF switching signal generation circuit 301 are explained with regard to the following two cases, (A) when only ordinary data signals are input and (B) when composite signals are input.

(A) When Only An Ordinary Data Signal Is Input (when no disturbance signal is recognized)

Since the disturbance signal is not superposed on the data signal, the potential of the comparator 72 does not exceed the voltage of the constant voltage source 71 shown in FIG. 2. Therefore, the output voltage of the comparator 72 maintains its logical level "H". Accordingly, since the input potential of the one-shot circuit 77 does not change, the output potential at node C does not change either and, accordingly, maintains the logical level "H". Therefore, the P-channel MOS transistor 21 does not operate (is in the off, i.e., non-conducting, state). Accordingly, the low pass filter 201 comprises the resistor 13 and the capacitor 41, which has a cut-off frequency ($f_{Ti}$), for example, of about several hundred KHz as shown in FIG. 4. Explanation of the low pass filter 202 is omitted because it is similar to the low pass filter 201 previously described. As described above, since the disturbance signal waveform is not detected in the amplifier 206 when only ordinary data signals are input, the signals input into the non-inverting input terminal 1 and the inverting input terminal 2 pass through the amplifier 203 and are output to the non-inverting output terminal 5 and the inverting output terminal 6, respectively. When the disturbance signal is not input to the input terminal 1, a characteristic (i) of the low pass filter is obtained, as shown in FIG. 4. The low pass filters 201 and 202 are constructed so that the resistors 13 and 16 are connected to the respective input terminals 1 and 2, which prevents the transistors 31 and 36 from floating when disturbance signals are not input into the input terminals 1 and 2.

(B) When Data Signal And Superposed Disturbance Waveform Are Input

When a data signal and superposed disturbance waveform are input into the input terminals 1 and 2, the DC level of the inverted input terminal 1 rises higher momentarily and the output of the comparator 72 changes to a logical level "L". Accordingly, the output of the comparator 72 passes through the inverters 73-76 and changes the input of the one-shot circuit 77 to a logical level "L". Thereby, the output of the one-shot circuit 77 becomes a logical level "H". When the voltage potential at node C changes to the logical level "L", for example, for several μsec (time t1) as shown in FIG. 3C, the resistors 13 and 14 in the LPF 201 and the resistors 16 and 17 in the LPF 202 are connected in parallel, respectively. Accordingly, the low pass filters 201 and 202 operate as, for example, a low pass filter having a cut-off frequency ($f_{Tii}$) of several MHz (characteristic (ii) of FIG. 4). The cut-off frequency $f_{Tii}$ of several MHz is selected so that a data signal does not pass, although the disturbance signal passes. As described above, it is possible to extract only the disturbance waveform (FIGS. 3E and 3F) by setting the cut-off frequency $f_{Tii}$ of the low pass filter at several MHz. It is, therefore, possible to cancel only the disturbance waveform by adding the detected disturbance waveform, in anti-phase, to the composite output signals that have passed through the amplifier 206 after adjusting the DC level of the amplifier 206 to the DC level of the amplifier 203, using the DC level regulation circuits 204 and 205. As described above, using the disturbance signal suppression circuit 133 and the LPF switching signal generation circuit 301, it is possible to obtain data signals that are not affected by the disturbance waveform at the non-inverting output terminal 5 and at the inverting output terminal 6.

As described above, almost a complete disturbance waveform, including a rising portion (FIGS. 3E and 3F), can be extracted by providing the low pass filter having a cut-off frequency $f_{Tii}$ of several MHz. Therefore, it is possible to cancel the whole disturbance waveform including a rising portion by adding this detected disturbance waveform, in anti-phase, to the composite output signal that has passed through the amplifier 206, after adjusting the DC level of the amplifier 206 to a DC level of the amplifier 203 using the DC level regulation circuits 204 and 205.

Accordingly, by changing the cut-off frequency of the LPF when a disturbance signal appears, only the disturbance waveform is extracted from the data signal on which the disturbance waveform is superposed. Then, the extracted waveform is added, in anti-phase, to the composite data signal on which the disturbance waveform is superposed. Thereby, the present invention provides an amplifier for an MR head having a simple construction and producing a data signal having little distortion and hardly affected by disturbances.

Embodiment 2

In a second embodiment of the present invention, the disturbance signal included in the composite signal is extracted more precisely than in the first embodiment. By extracting the disturbance signal precisely, it possible to cancel the disturbance components included in the composite signal better. The second embodiment is explained using FIG. 5 and FIG. 6.

Figure 5:
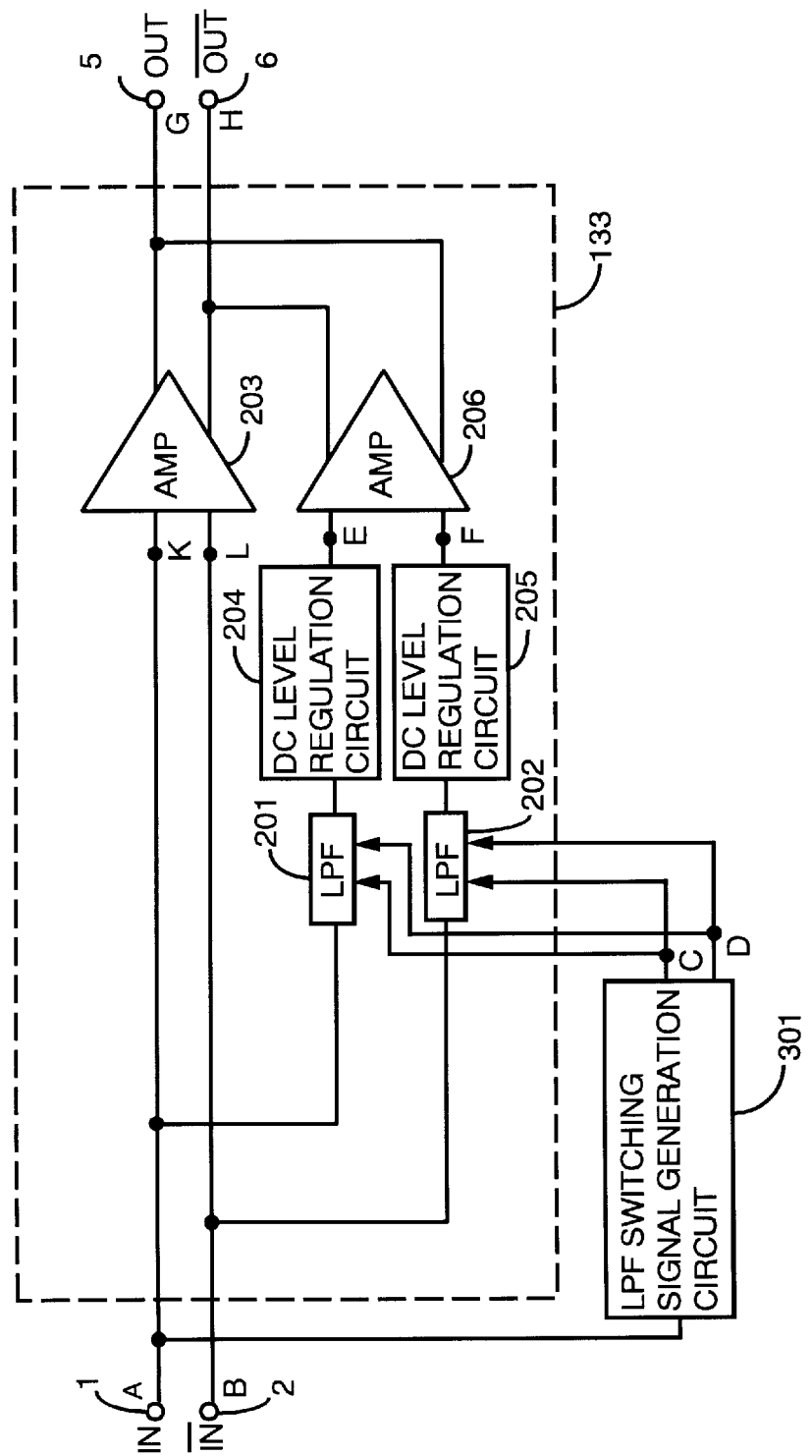
FIG. 5 shows a disturbance signal suppression circuit for suppressing a disturbance waveform and an LPF switching signal generation circuit of a second embodiment of the present invention.
Figure 6:
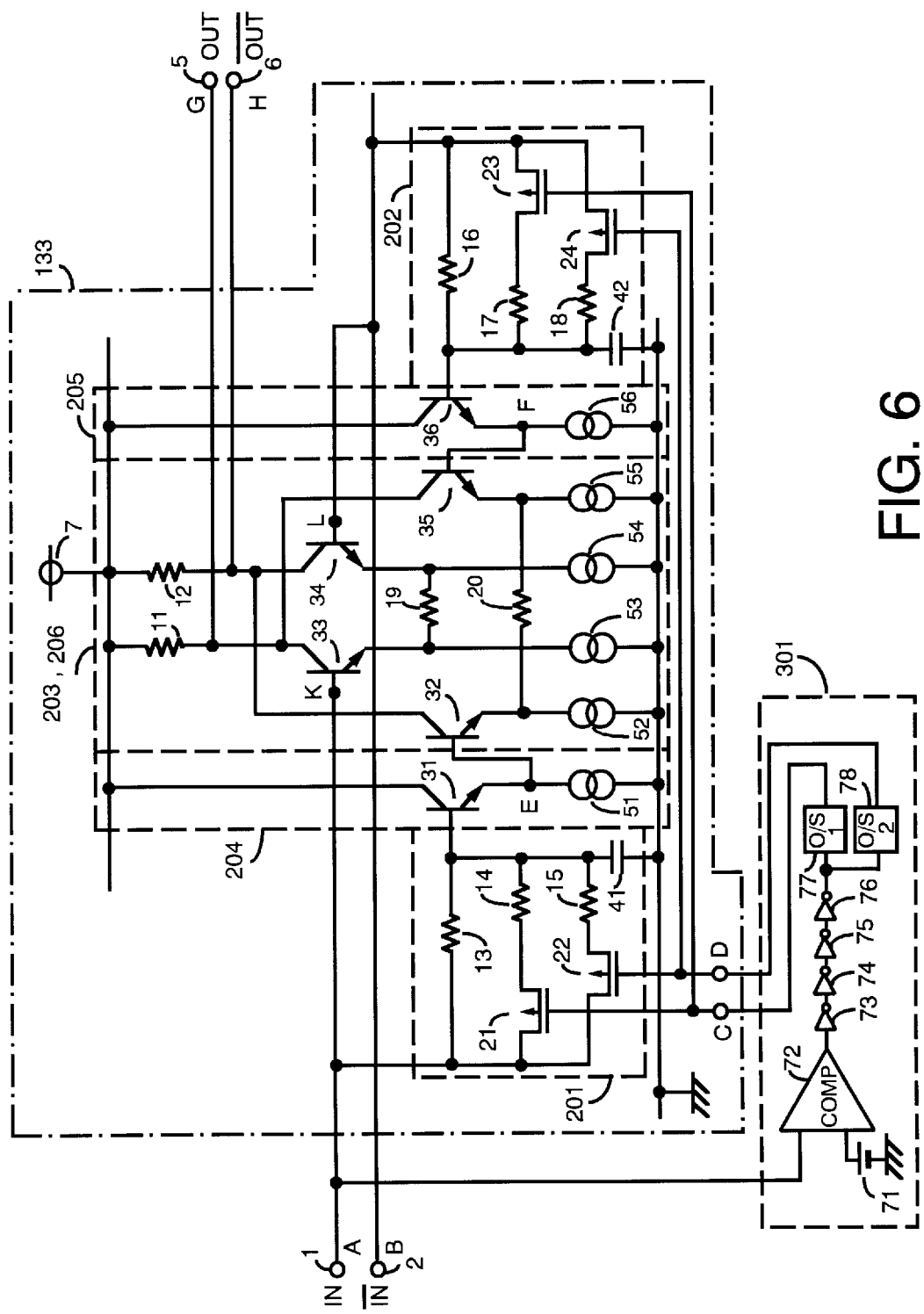
FIG. 6 shows the circuit of FIG. 1 realized using transistors in a second embodiment of the present invention.

FIG. 5 shows a disturbance signal suppression circuit 133 for suppressing a disturbance waveform, and an LPF switching signal generation circuit 301 for detecting a disturbance signal generated by thermal asperity, which are portions of an amplifier for an MR head in the second embodiment of the present invention. In the second embodiment, the low pass filter 201, the low pass filter 202, and the LPF switching signal generation circuit 301 are different from those in the first embodiment. The operations of the different portions are explained in detail, but explanation of other portions is omitted because their operations are the same as in the first embodiment. FIG. 6 shows an embodiment of the circuit of FIG. 5 as IC circuits.

Figure 7:
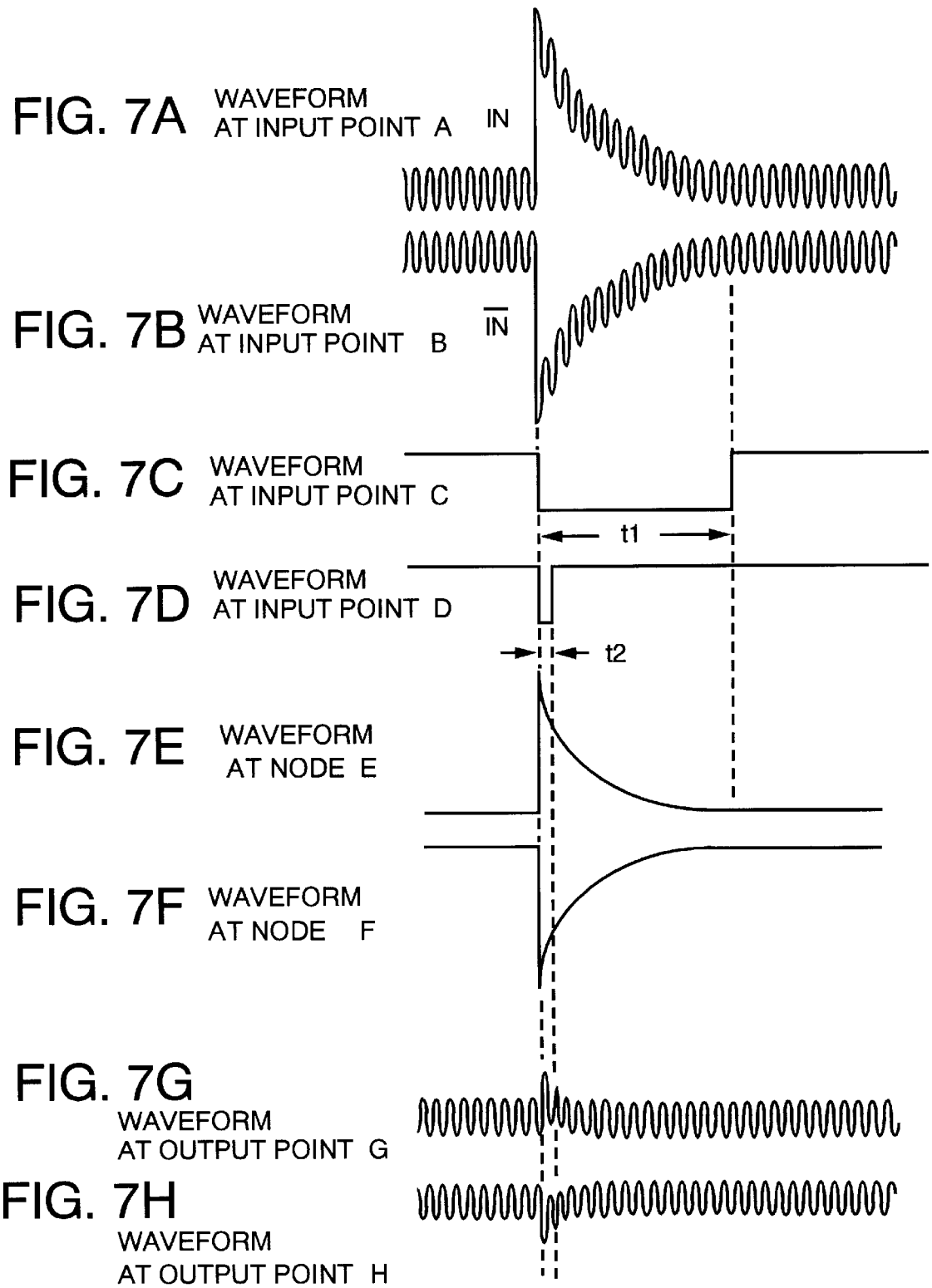
FIGS. 7A–7H show signal waveforms at respective nodes in the circuit shown in FIG. 6 when a disturbance signal is generated.
Figure 8:
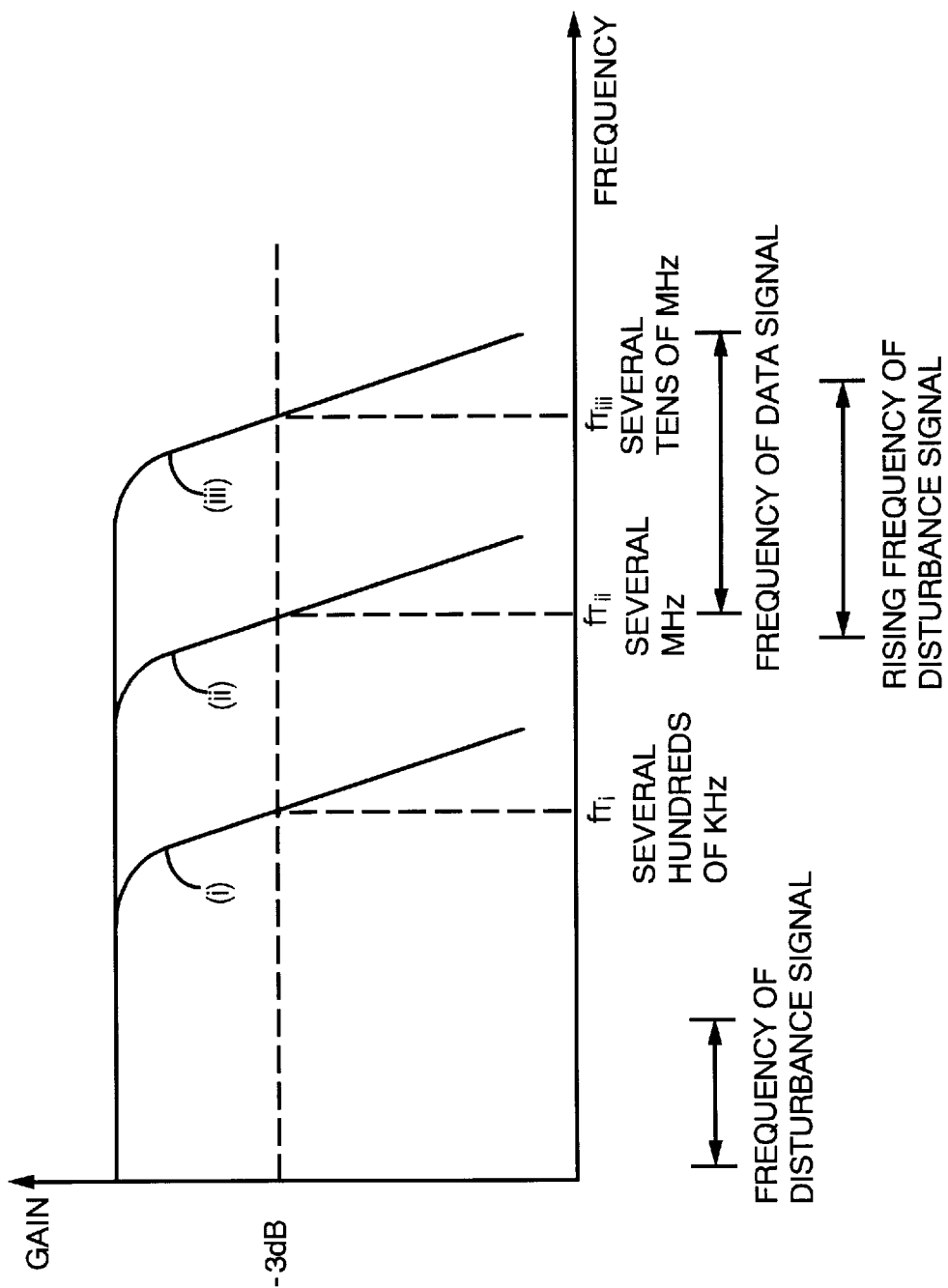
FIG. 8 shows a frequency characteristic of an LPF in the second embodiment of the present invention.

FIG. 6 shows a circuit that realizes the disturbance signal suppression circuit 133 for suppressing the disturbance signal and an LPF switching signal generation circuit 301 of FIG. 5. FIGS. 7A–7H show waveforms of respective portions (nodes A–H) in the disturbance signal suppression circuit 133 in FIG. 6 when the disturbance signal is input. FIG. 8 illustrates cut-off frequencies of the LPFs 201 and 202.

LPF 201 and 202

In FIG. 6, the LPF 201 of FIG. 5 comprises resistors 13, 14, and 15, a capacitor 41, a P-channel MOS 21, and a P-channel MOS 22. Similarly, the LPF 202 of FIG. 5 comprises resistors 16, 17, and 18, a capacitor 42, a P-channel MOS 23, and a P-channel MOS 24. The resistances of the resistors 13, 14, and 15, and the resistors 16, 17, and 18 increase in the order of the reference number. For example, the resistances of the resistors 13 and 16 are several tens of kΩ, the resistances of the resistors 14 and 17 are several kΩ, and the resistances of the resistors 15 and 18 are several hundreds of Ω. The capacitances of the capacitors 41 and 42 are selected in order to produce an appropriate cut-off frequency (for example, several tens of pF), respectively. The first low pass filter (characteristic (i) of FIG. 8) comprises the resistor 13 and the capacitor 41. The second low pass filter (characteristic (ii) of FIG. 8) comprises a capacitor 41 and a parallel circuit of the resistors 13 and 14, realized by turning on the P-channel MOS 21 according to the first signal applied to the node C of the LPF switching signal generation circuit 301. The third low pass filter (characteristic (iii) of FIG. 8) comprises a capacitor 41 and a parallel circuit of the resistors 13, 14, and 15, realized by turning on both the P-channel MOS 21 and the P-channel MOS 22 according to the first and second signals from the node C and the node D of the LPF switching signal generation circuit 301. The cut-off frequency of the first low pass filter is selected to be, for example, several hundreds of KHz, the cut-off frequency of the second low pass filter is selected to be, for example, several MHz, and the cut-off frequency of the third low pass filter is selected to be, for example, several tens of MHz. An explanation of the low pass filter 202 is omitted because it is similar to the low pass filter 201.

LPF Switching Signal Generation Circuit 301

The LPF switching signal generation circuit 301 detects a disturbance signal and generates signals (FIGS. 7C and 7D) for switching characteristics of the LPF. FIG. 7C shows a first LPF signal, and FIG. 7D shows a second LPF switching signal. A node C and a node D are pulse signal output terminals that output pulse signals for switching the cut-off frequencies of the LPFs 201 and 202. The disturbance signal suppression circuit 133 comprises the LPF 201, the LPF 202, and the amplifier 203. The disturbance signal suppression circuit 133 has output terminals 5 and 6. The signals at output terminal 6 and at output terminal 5 are anti-phase signals.

The LPF switching signal generation circuit 301 of FIG. 5 and FIG. 6 comprises a constant voltage source 71, a comparator 72, inverters 73–76, a first one-shot circuit (O/S1) 77, and a second one-shot circuit (O/S2) 78. The output of the LPF generation circuit 301 turns the P-channel MOS transistors 21 and 22 on and off and thereby connects the resistors 14 and 15 in parallel to the resistor 13 in order to change the characteristics of the low pass filter in a plurality of stages. The construction of the circuit is explained in detail as follows.

The potential of the constant voltage source 71 is usually set higher than the DC potential of the non-inverting input terminal 1, input to a comparator 72, which makes the output of the comparator always be logical level "H". For example, when the DC potential of non-inverting input terminal node A is about 4 V, the voltage of the constant voltage source 71 is about 4.5 V. When the potential of non-inverting input terminal node A is higher than 4.5 V, the output of the comparator 72 changes to logical level "L", and a signal of logical level "L" is transmitted to the oneshot circuit 77 through an even number of inverters. The one-shot circuit 77 receives n logical level "L" signals and makes the output (node C) logical level "L" during a time ti, as shown in FIG. 7C. When node C turns to logical level "L", the resistor 14 is connected in parallel to the resistor 13 because the P-channel MOS transistor 21 turns on. The one-shot circuit 78 receives a logical level "L" signal and makes the output (node D) logical level "L" during a time t2, as shown in FIG. 7D. When node D turns logical level "L", the resistor 15 is connected in parallel to the resistor 13 because the P-channel MOS transistor 22 turns on. Accordingly, the resistors 13, 14, and 15 are connected in parallel during the time t2, and the low pass filter whose cut-off frequency ($f_{Tiii}$) is, for example, several tens of MHz, is constructed as shown in (iii) of FIG. 8. During the period of t1, except t2, the resistors 14 and 15 are connected to the resistor 13 in parallel. Therefore, a low pass filter with a cut-off frequency ($f_{Tii}$) of, for example, several MHz, is constructed as shown in (ii) of FIG. 8.

Next, the operation of an amplifier for an MR head of the present invention, constructed as described above, is explained. In the description of the operation given below, it is considered that signals superposed on the data signal (generally, about several MHz to 100 MHz) and the disturbance signal (generally, less than about 200–300 KHz) (composite signal), as shown in FIGS. 7A and 7B, are input into the non-inverting input terminal 1 (input node A) and the inverting input terminal 2 (input node B), respectively, in the disturbance signal suppression circuit 133, a portion of the amplifier for the MR head. The signal waveform input to the non-inverting input terminal 1 and to the inverting input terminal 2 is input to input terminals K and L of the amplifier 203, respectively. At the same time, the signal at node A is transmitted to the LPF 201 and also to the LPF switching signal generation circuit 301. The signal at node B is transmitted to the LPF 202. Signals passing through the amplifier 203 are amplified and output to the non-inverting output terminal 5 and the inverting output terminal 6.

The signal at node A input into the LPF 201 is processed as follows. Operation and signal waveforms of the disturbance signal suppression circuit 133 and the LPF switching signal generation circuit 301 are explained with regard to the following two cases, (A) when only ordinary data signals are input and (B) when composite signals are input.

(A) When Only An Ordinary Data Signal Is Input (when no disturbance signal is recognized)

Since the disturbance signal is not superposed on the data signal, the DC potential of the comparator 72 does not exceed the voltage of the constant voltage source 71 shown in FIG. 6. Therefore, the output voltage of the comparator 72 maintains its state of logical level "H". Accordingly, since the input potential of the one-shot circuits 77 and 78 does not change, the output potentials at nodes C and D do not change either and, accordingly, maintain the logical level "H". Therefore, the P-channel MOS transistors 21 and 22 do not operate (are in an off state). Accordingly, the low pass filter 201 includes the resistor 13 and the capacitor 41 and has a cut-off frequency ($f_{Ti}$), for example, of about several hundred KHz as shown in FIG. 8. Explanation of the low pass filter 202 is omitted because it is similar to the low pass filter 201. As described above, since the disturbance signal waveform is not detected in the amplifier 206 when only ordinary data signals are input, the signals input into the non-inverting input terminal 1 and the inverting input terminal 2 pass through the amplifier 203 and are output to the non-inverting output terminal 5 and the inverting output terminal 6, respectively. When the disturbance signal is not input to the input terminal 1, characteristic (i) of the low pass filter is obtained as shown in FIG. 8. The low pass filters 201 and 202 are constructed so that the resistors 13 and 16 are connected to the respective input terminals 1 and 2, preventing the transistors 31 and 36 from floating when disturbance signals are not input into the input terminals 1 and 2.

(B) When Data Signal And Superposed Disturbance Waveform Are Input

When a data signal and a superposed disturbance waveform are input to the input terminals 1 and 2, the DC level of the inverted input terminal 1 rises higher momentarily and the output of the comparator 72 changes to a logical level "L". Accordingly, the output of the comparator 72 passes through the inverters 73–76 and changes the input of the one-shot circuits 77 and 78 to a logical level "L". Thereby, the output node C of the one-shot circuit 77 and the output node D of the one-shot circuit 78 become logical level "H", respectively. When the voltage potential at node C changes to the logical level "L", for example, for several μsec (time t1), as shown in FIG. 7C, the resistors 13 and 14 in the LPF 201 and the resistors 16 and 17 in the LPF 202 are connected in parallel, respectively. Accordingly, the low pass filters 201 and 202 operate as, for example, a low pass filter having a cut-off frequency ($f_{Tii}$) of several MHz (characteristic (ii) of FIG. 8). The cut-off frequency $f_{Tii}$ of several MHz is selected so that a data signal itself cannot pass, although the disturbance frequency can pass. As described above, it is possible to extract only the disturbance waveform (FIGS. 7E and 7F) by setting the cut-off frequency $f_{Tii}$ of the low pass filter at several MHz. It is, therefore, possible to cancel only the disturbance waveform by adding this detected disturbance waveform, in anti-phase, to the composite output signals that have passed through the amplifier 206 after adjusting the DC level of the amplifier 206 to the DC level of the amplifier 203 using the DC level regulation circuits 204 and 205. As described above, using the disturbance signal suppression circuit 133 and the LPF switching signal generation circuit 301, it is possible to obtain data signals which are not affected by the disturbance waveform at the non-inverting output terminal 5 and at the inverting output terminal 6.

However, the rise time of the disturbance signal caused by contact with an MR head is momentary, and a frequency (about several MHz to about several tens of MHz) of the rising pulse is close to the frequency of the data signal or higher than that frequency. Therefore, a rising waveform portion of the disturbance signal cannot be removed completely using the filter characteristic (ii) of FIG. 8. In order to avoid such a problem, the one-shot circuit 78 is set to operate only during rise time t2 of the disturbance signal, and the logical level "L" is output to the node D as shown in FIG. 7D. Thereby, the resistors 13, 14, and 15 in the low pass filter 201 and the resistors 16, 17, and 18 in the low pass filter 202 are connected in parallel. Therefore, the low pass filters 201 and 202 operate as low pass filters, for example, having a cut-off frequency ($f_{Tiii}$) of about several hundred MHz (characteristic (iii) of FIG. 8). This cut-off frequency (fTiii) of several hundred MHz is selected as a frequency, allowing the rising portion of the disturbance waveform to pass. As described above, by constructing a low pass filter having a cut-off frequency ($f_{Tiii}$) of several hundred MHz, it is possible to extract disturbance waveforms almost completely, including the rising portion as shown in FIGS. 7E and 7F. It is, therefore, possible to cancel the whole disturbance waveform, including the rising portion, by adding, in anti-phase, the detected disturbance waveform to the composite output signal that has passed through the amplifier 206 after adjusting the DC level of the amplifier 206 to a DC level of the amplifier 203 by the DC level regulation circuits 204 and 205.

Accordingly, by changing the cut-off frequency of the LPF when the disturbance signal appears, a more precise disturbance waveform than the second embodiment is extracted from the data signal with the disturbance waveform is superposed. Then, the extracted waveform is added, in anti-phase, to the composite data signal on which the disturbance waveform is superposed. Thereby, the present invention can provide an amplifier for an MR head having a simple construction, producing a data signal that is less distorted and hardly affected by a disturbance, as compared to the first embodiment.

Embodiment 3

Figure 9:
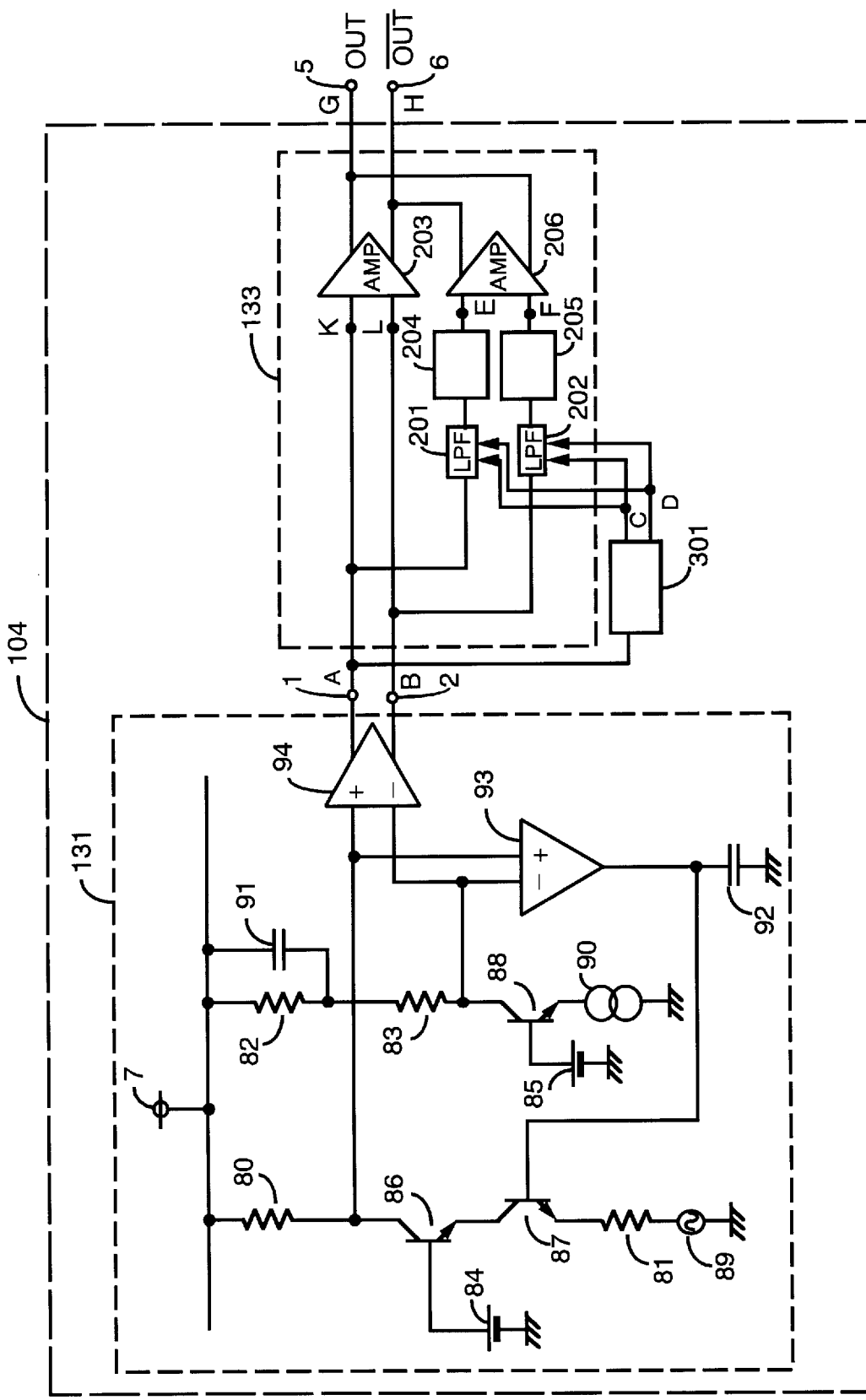
FIG. 9 shows a circuit of a third embodiment of the present invention.
Figure 10:
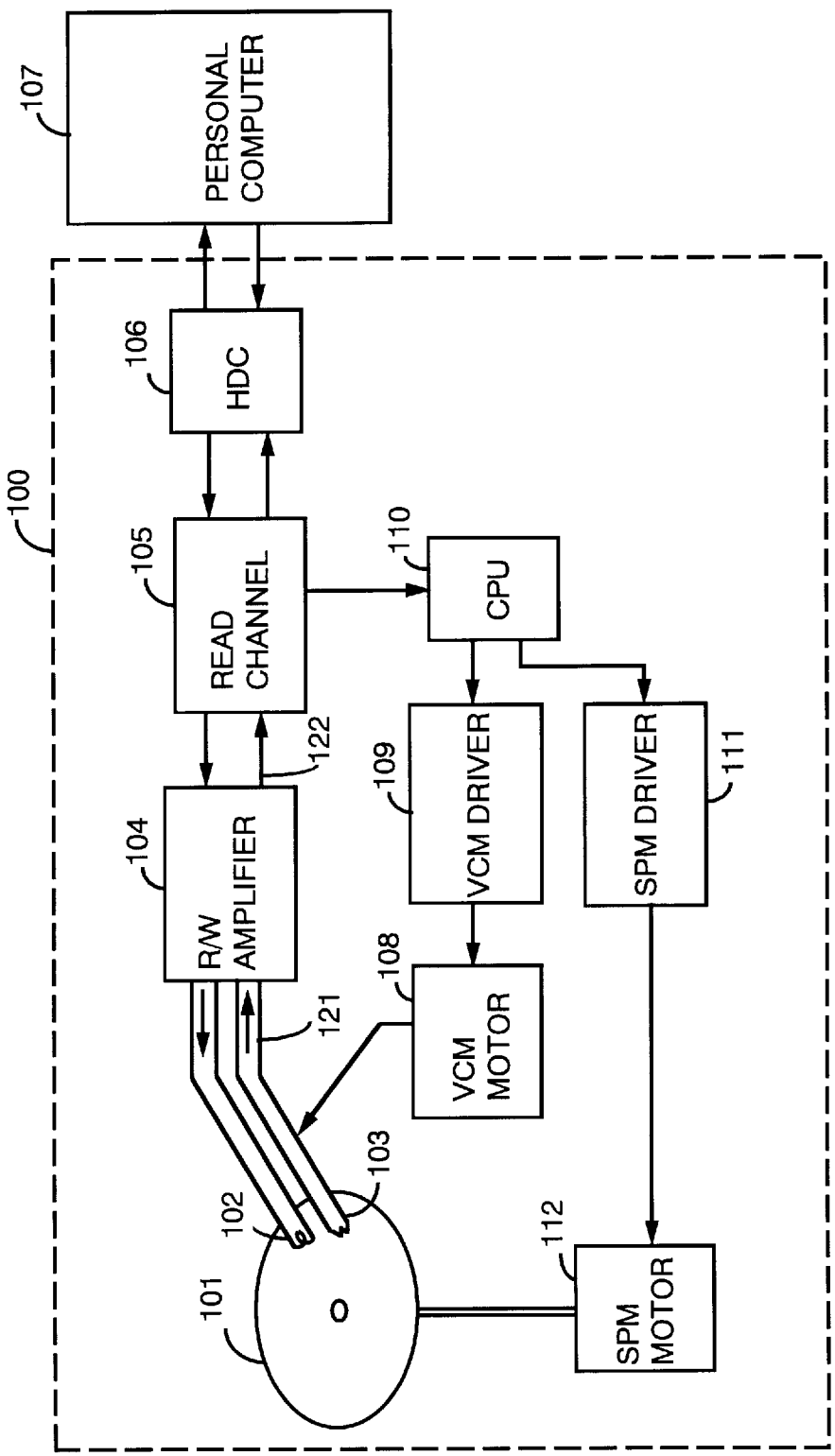
FIG. 10 shows a general construction of a conventional hard disk drive.
Figure 11:
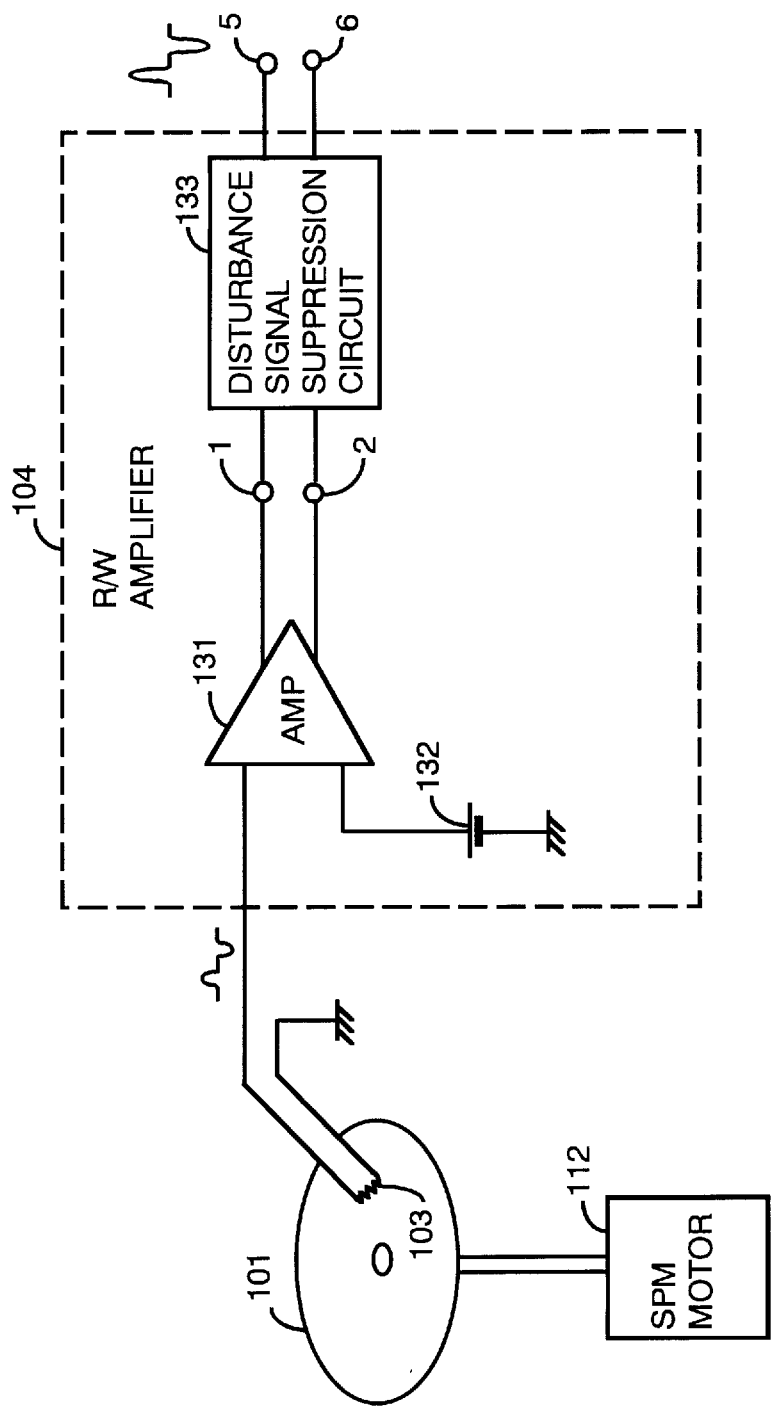
FIG. 11 shows a conventional R/W amplifier.
Figure 12A:
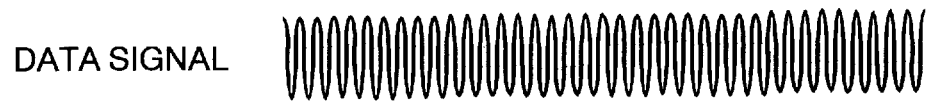
FIGS. 12A–12C show waveforms of a data signal and disturbance signal.
Figure 12B:
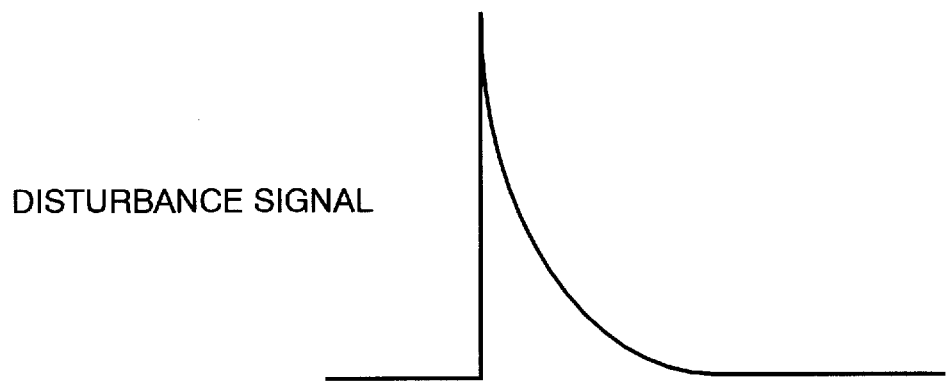
Figure 12C:
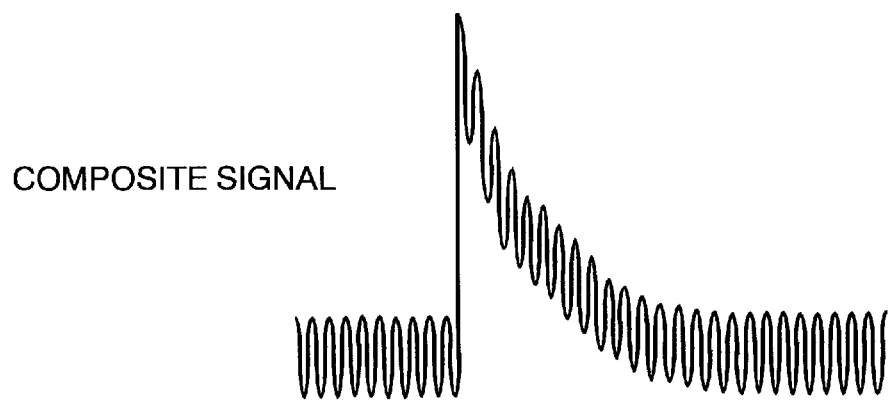

FIG. 9 shows an R/W amplifier for an MR head in a third embodiment of the present invention. In the third embodiment, a reading portion of the R/W amplifier 104 in FIG. 11 is realized by combining the amplifier for an MR head described above and a single end input type high-frequency amplifier. It is possible to provide a read portion of the R/W amplifier for the MR head with a better performance by realizing the read portion of the R/W amplifier 104 as explained for the second embodiment.

In FIG. 9, the pre-amplifier 131 comprises three transistors 86, 87, and 88, a differential amplifier 94, and a loop amplifier 93. The transistors 86 and 87 comprise a single end transistor amplifier that amplifies the input signals. The signal 89 from the MR head is applied to the emitter of the transistor 87 through the emitter and the resistor 81. The collector of the transistor 86 is connected to a power source 7 through a resistor 80. The collector of the transistor 86 is connected to the non-inverting input terminal of the differential amplifier 94. A signal from the MR head is transmitted to the non-inverting input terminal 1 of the disturbance signal suppression circuit 133 after the signal from the MR head is amplified by the transistor 86 and the differential amplifier 94.

The collector of the transistor 88 is connected to the power source 7 through the resistors 82 and 83, the emitter of the transistor 88 is grounded through the constant current source 90, and the base of the transistor 88 is connected to the constant voltage source 85. The inverting terminal of the loop amplifier 93 is connected to the collector of the transistor 88, and the non-inverting terminal of the loop amplifier 93 is connected to the non-inverting terminal of the differential amplifier 94. A capacitor 91 is connected in parallel with the resistor 82.

A current from the constant current source 90 flows through the resistors 82 and 83. A constant voltage is generated by the voltage drop and provided to the non-inverting terminal of the differential amplifier 94. The transistor 88 and the resistor 83 are inserted in order to equalize the impedance of non-inverting terminal and the inverting terminal of the differential amplifier 94. The loop amplifier 93 is provided for equalizing the DC voltage of each input terminal of the differential amplifier 94.

Next, the principle of making the DC potential difference between the non-inverting terminal and the inverting terminal of the differential amplifier 94 zero, using a feedback control loop comprised of the loop amplifier 93 and the single end input type transistor 87, is explained.

If the voltage of the non-inverting terminal of the differential amplifier 94 rises higher than the voltage of the inverting terminal, the output voltage of the loop amplifier 93 rises higher. Then, the base voltage of the single end input type transistor 87 rises higher and, therefore, the collector current of the single end input type transistor 87 increases. As a result, the voltage drop of the resistor 80 increases, and the voltage of the non-inverting terminal of the differential amplifier 94 falls.

Adversely, if the voltage of the non-inverting terminal falls lower than the voltage of the inverting terminal, the output voltage of the loop amplifier 93 falls, and then the base voltage of the single end input type transistor 87 falls and, therefore, the collector current of the single end input type transistor 87 decreases. As a result, the voltage drop of the resistor 80 decreases, and the voltage on the non-inverting terminal of the differential amplifier 94 rises. As described above, the voltages of the non-inverting terminal and the inverting terminal are always equalized by the feedback circuit.

As described above, an inverted composite signal can be output to the non-inverting input terminal 1 and the inverting input terminal 2 by applying the same potential to the non-inverting terminal and the inverting terminal in the differential amplifier 94. The composite signal is obtained in this way and applied to the disturbance signal suppression circuit 133. Therefore, the R/W amplifier uses an amplifier for an MR head that provides a data signal less influenced and distorted by a disturbance.

What is claimed is:

1. An amplifier for a magnetoresistive (MR) head comprising:
    a non-inverting input terminal for receiving from an MR head a composite signal including a data signal on which a disturbance signal is superposed;
    an inverting input terminal for receiving an inverted signal, an inversion of the composite signal input to the non-inverting input terminal;
    a first differential amplifier for receiving the signal input to the non-inverting input terminal at a first, non-inverting input terminal, for receiving the signal input to the inverting input terminal at a second, inverting input terminal, and outputting the two signals differentially amplified;
    an LPF switching signal generation circuit receiving the signal input to the non-inverting input terminal for generating a control signal having a fixed period when a disturbance signal is superposed on a data signal;
    a first low pass filter receiving the composite signal from the non-inverting input terminal and the control signal, switching cut-off frequencies according to the control signal, and outputting a filtered signal to an inverting output terminal of the amplifier for an MR head; and
    a second low pass filter receiving the composite signal from the inverting input terminal and the control signal and switching cut-off frequencies according to the control signal and outputting a filtered signal to a non-inverting output terminal of the amplifier for an MR head.

2. The amplifier for an MR head of claim 1, further comprising a second differential amplifier receiving a signal output from the first low pass filter at a non-inverting input terminal and receiving a signal output from the second low pass filter at an inverting input terminal, a non-inverting output terminal of the second differential amplifier being connected to the inverting output terminal of the amplifier for an MR head and an inverting output terminal of the second differential amplifier being connected to the non-inverting output terminal of the amplifier for an MR head.

3. The amplifier for an MR head of claim 2, further comprising:
    a first DC level regulation circuit receiving an output of the first low pass filter for equalizing a DC level of a non-inverting input terminal of the second differential amplifier and a DC level of the second, inverting input terminal of the first differential amplifier; and
    a second DC level regulation circuit receiving an output of the second low pass filter for equalizing a DC level of an inverting input terminal of the second differential amplifier and a DC level of the first, non-inverting input terminal of the first differential amplifier.

4. The amplifier for an MR head of claim 1, wherein the LPF switching signal generation circuit comprises:
    a comparator having a first input terminal connected to the non-inverting input terminal and a second input terminal connected to a constant voltage source; and
    a one-shot circuit connected to an output terminal of the comparator for outputting a pulse having a fixed period.

5. The amplifier for an MR head of claim 1, wherein each of the first and second low pass filters comprises:
    a series circuit of a first resistor and a capacitor connected between an input terminal and a ground terminal; and
    a series circuit of a second resistor and an MOS transistor, connected in parallel with the first resistor, wherein a pulse having a first period received from the LPF switching signal generation circuit is applied to the MOS transistor and a filtered output of the low pass filter is output from a node of the first resistor and the capacitor.

6. The amplifier for an MR head of claim 5, wherein
    when an LPF switching signal is not output by the LPF switching signal generation circuit, each of the first and second low pass filters operates as low pass filters having a first cut-off frequency, and
    when a pulse having a fixed period received from the LPF switching signal generation circuit is applied to each MOS transistor, each of the first and second low pass filters operates as a low pass filter having a second cut-off frequency.

7. An amplifier for a magnetoresistive (MR) head comprising:
    a first input terminal receiving from an MR head a composite signal including a data signal on which a disturbance signal is superposed;

a second input terminal receiving a signal that is an inversion of the composite signal input to the first input terminal;

a first differential amplifier receiving the signal input to the first input terminal at a non-inverting-input terminal, for receiving the signal input to the second input terminal at an inverting input terminal, and outputting the two signals differentially amplified;

an LPF switching signal generation circuit receiving the signal input to the first input terminal for generating a first control signal having a first fixed period and a second control signal having a second fixed period when the disturbance signal appears from an MR head;

a first low pass filter receiving the composite signal from the first input terminal and the first and second control signals for switching cut-off frequencies according to the first and second control signals, and for outputting a filtered signal to an inverting output terminal of the amplifier for an MR head; and a second low pass filter receiving the signal from the second input terminal and the first and second control signals for switching cut-off frequencies according to the first and second control signals, and for outputting a filtered signal to a non-inverting output terminal of the amplifier for an MR head.

8. The amplifier for an MR head of claim 7, further comprising a second differential amplifier receiving a signal output from the first low pass filter at a non-inverting input terminal and receiving a signal output from the second low pass filter at an inverting input terminal, a non-inverting output terminal of the second differential amplifier being connected to the inverting output terminal of the amplifier for an MR head and an inverting output terminal of the second differential amplifier being connected to the non-inverting output terminal of the amplifier for an MR head.

9. The amplifier for an MR head of claim 8, comprising:

a first DC level regulation circuit receiving an output of the first low pass filter for equalizing a DC level of the non-inverting input terminal of the second differential amplifier to a DC level of the inverting input terminal of the first differential amplifier; and a second DC level regulation circuit receiving an output of the second low pass filter for equalizing a DC level of an inverting input terminal of the second differential amplifier to a DC level of the inverting input terminal of the first differential amplifier.

10. The amplifier for an MR head of claim 7, wherein the LPF switching signal generation circuit comprises:

a comparator having a first input terminal connected to the first input terminal and a second input terminal connected to a constant voltage source;

a first one-shot circuit connected to an output terminal of the comparator for outputting a pulse having a first fixed period; and a second one-shot circuit connected to an output terminal of the comparator for outputting a pulse having a second fixed period.

11. The amplifier for an MR head of claim 7, wherein each of the first and second low pass filters comprises:

a series circuit of a first resistor and a capacitor connected between an input terminal and a ground terminal;

a series circuit of a second resistor and a first MOS transistor connected in parallel to the first resistor; and a series circuit of a third resistor and a second MOS transistor connected in parallel to the first resistor wherein a first pulse having a first period received from the LPF switching signal generation circuit is applied to the first MOS transistor, a second pulse having a second period received from the LPF switching signal generation circuit is applied to the second MOS transistor and a filtered output of the low pass filter is output from a node of the first resistor and the capacitor.

12. The amplifier for an MR head of claim 11, wherein when an LPF switching signal is not output by the LPF switching signal generation circuit, each of the first and second low pass filters operates as low pass filters having a first cut-off frequency;

when a first pulse having a first period received from the LPF switching signal generation circuit is applied to a first MOS transistor, each of the first and second low pass filters operates as a low pass filter having a second cut-off frequency; and when a first pulse having a first period and a second pulse having a second period received from the LPF switching signal generation circuit are applied to the first MOS transistor and the second MOS transistor, respectively, the first and second low pass filters operate as a low pass filter having a third cut-off frequency.

* * * * *

UNITED STATES PATENT AND TRADEMARK OFFICE
CERTIFICATE OF CORRECTION

PATENT NO.   : 5,852,521
DATED        : December 22, 1998
INVENTOR(S)  : Umeyama et al.

It is certified that error appears in the above-identified patent and that said Letters Patent is hereby corrected as shown below:

Column 17, Line 41, change "inverting" to

--non-inverting--.

Signed and Sealed this

Sixth Day of April, 1999

Attest:

Q. TODD DICKINSON

*Attesting Officer*    *Acting Commissioner of Patents and Trademarks*